(12) United States Patent
Xiao

(10) Patent No.: US 8,625,297 B2
(45) Date of Patent: Jan. 7, 2014

(54) PACKAGE STRUCTURE WITH ELECTRONIC COMPONENT AND METHOD FOR MANUFACTURING SAME

(75) Inventor: Jun-Yi Xiao, Zhongshan (CN)

(73) Assignee: Ambit Microsystems (Zhongshan) Ltd., Zhongshan (CN)

( * ) Notice: Subject to any disclaimer, the term of this patent is extended or adjusted under 35 U.S.C. 154(b) by 159 days.

(21) Appl. No.: 13/206,532

(22) Filed: Aug. 10, 2011

(65) Prior Publication Data

US 2013/0021772 A1    Jan. 24, 2013

(30) Foreign Application Priority Data

Jul. 20, 2011    (CN) .......................... 2011 1 0203900

(51) Int. Cl.
*H05K 7/00*    (2006.01)

(52) U.S. Cl.
USPC ........... 361/760; 361/778; 361/818; 361/779; 257/E25.005; 257/E25.013

(58) Field of Classification Search
USPC .......... 361/760, 778, 779, 818, 719; 257/686, 257/E25.005, E25.013
See application file for complete search history.

(56) References Cited

U.S. PATENT DOCUMENTS

| | | | |
|---|---|---|---|
| 5,297,006 A | 3/1994 | Mizukoshi | |
| 2007/0285114 A1* | 12/2007 | Pedersen et al. | 324/755 |
| 2009/0085138 A1 | 4/2009 | Kim et al. | |
| 2009/0250707 A1* | 10/2009 | Zhou et al. | 257/81 |
| 2010/0117212 A1* | 5/2010 | Corisis et al. | 257/686 |
| 2010/0151747 A1* | 6/2010 | Lu | 439/816 |

* cited by examiner

*Primary Examiner* — Timothy Thompson
*Assistant Examiner* — Andargie M Aychillhum
(74) *Attorney, Agent, or Firm* — Altis Law Group, Inc.

(57) ABSTRACT

A package structure comprises a substrate, a plurality of electronic components configured and structured on the substrate, a plurality of metal resilient units electrically connected to the substrate, and an encapsulation body encapsulating the plurality of electronic components and the plurality of resilient units together with the substrate. Part of each of the plurality of metal resilient units away from the substrate is exposed out of an exterior surface of the encapsulation body.

11 Claims, 5 Drawing Sheets

PACKAGE STRUCTURE WITH ELECTRONIC COMPONENT AND METHOD FOR MANUFACTURING SAME

BACKGROUND

1. Technical Field

The present disclosure generally relates to package structures with embedded electronic components and methods for manufacturing the same, more particularly to a package structure with metal resilient units encapsulated in an encapsulation body.

2. Description of Related Art

Generally, a package structure with embedded electronic components (e.g. capacitors,) includes a substrate having a cavity. An electronic component is mounted in the cavity and encapsulated within the substrate. However, it is difficult to reduce cost of the package structure due to complicated fabricating process involved in fabrication of the opening in the substrate. Furthermore, size of the electronic component is required to be smaller than the opening of the substrate to be received in the cavity, therefore, the package structure cannot employ multifarious electronic components.

Therefore, a need exists in the industry to overcome the described problem.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
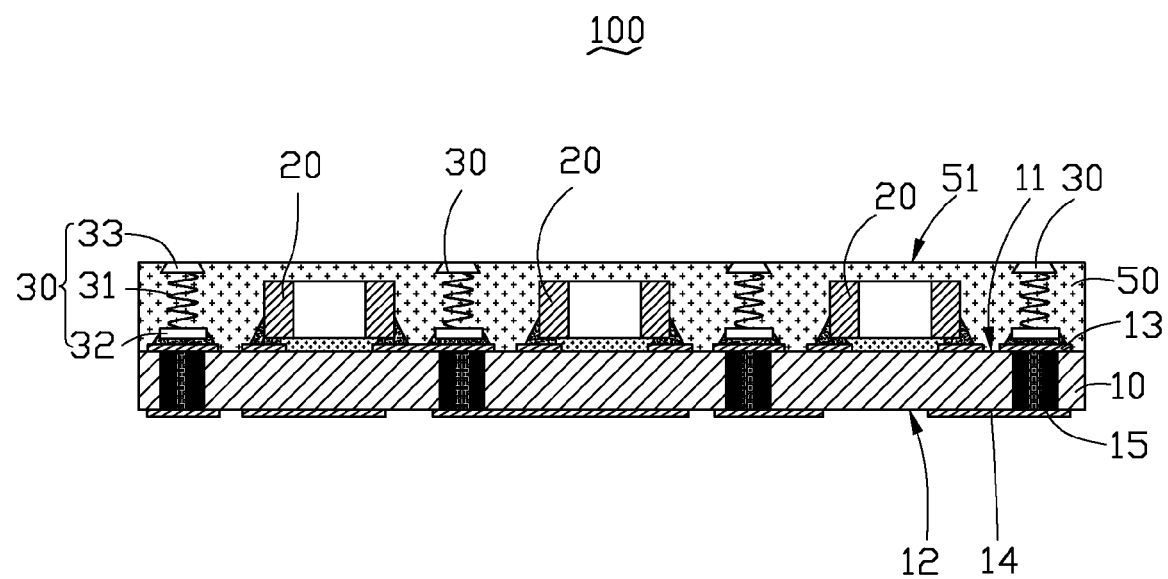
FIG. 1 is a schematic view of a package structure with a plurality of electronic components and a plurality of metal resilient units encapsulated on a substrate of an exemplary embodiment of the disclosure.
Figure 2:
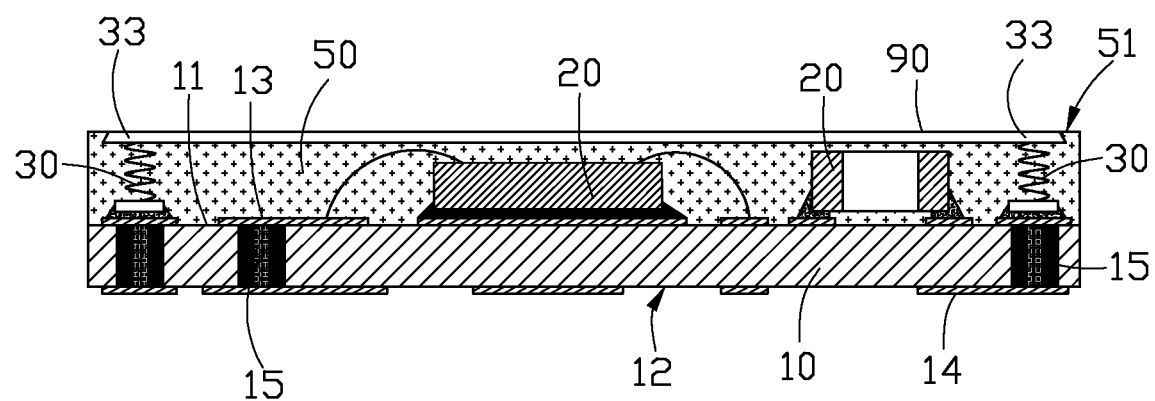
FIG. 2 is another view of the package structure of FIG. 1, in which the package structure has a structure for protecting the electronic components from electromagnetic interference (EMI).

With reference to FIG. 1 and FIG. 2, a package structure 100 comprises a substrate 10, a plurality of electronic components 20 configured and structured on the substrate 10, a plurality of metal resilient units 30 electrically connected to the substrate 10, and an encapsulation body 50 encapsulating the plurality of electronic components 20 and the plurality of resilient units 30 together with the substrate 10. Part of each of the plurality of metal resilient units 30 away from the substrate 10 is exposed out of an exterior surface 51 of the encapsulation body 50. By this way, input/output interfaces of the substrate 10 are transmitted to the exterior surface 51 of the first encapsulation body 50 by way of the metal resilient units 30. In the embodiment, the electronic component 20 can be a capacitor, a integrated circuit, for example, and the first encapsulation body 50 is an epoxy resin.

The substrate 10 comprises a first surface 11, a second surface 12 opposite to the first surface 11, a first conductive layer 13 located on the first surface 11, a second conductive layer 14 on the second surface 12, and a plurality of conductive holes 15 running through the first surface 11 and the second surface 12 to electrically connect the first conductive layer 13 with the second conductive layer 14. In the embodiment, the input/output interfaces of the substrate 10 are configured on the second conductive layer 14 of the substrate 10.

The first electronic components 20 are electrically connected to the first conductive layer 13 of the substrate 10 and encapsulated on the first surface 11 of the substrate 10.

In the embodiment, each of the metal resilient units 30 comprises a metal resilient element 31, a first metal sheet 32 and a second metal sheet 33. The first metal sheet 32 and the second metal sheet 33 are located on two ends of the metal resilient element 31, respectively. The first metal sheet 32 is fixed on the first surface 11 of the substrate 10 and electrically connected to the first conductive layer 13 of the substrate 10. The second metal sheet 33 is exposed out of the exterior surface 51 of the first encapsulation body 50. By this structure, the input/output interfaces of the substrate 10 on the second conductive layer 14 are transmitted to the first conductive layer 13 via the conductive holes 15, and subsequently transmitted to the exterior surface 51 of the first encapsulation body 50 via the metal resilient units 30. That is, the substrate 10 communicates with exterior circuits via the second metal sheets 33 of the metal resilient units 30 exposed out of the exterior surface 51 of the first encapsulation body 50.

During a molding process, the metal resilient units 30 are protected from damaged by a compressive stress of a module, due to the resilient capability of the metal resilient elements 31. In addition, the second metal sheets 33 of the metal resilient units 30 always keep contacted with an upper portion of the module during the molding process because of the resilient capability of the metal resilient elements 31, which not only prevents the epoxy resin covering the second metal sheets 33 to ensure the second metal sheets 33 exposed on the exterior surface 51 of the first encapsulation body 50, but also avoids height differences between the metal resilient units 30 to ensure a good planeness of the exterior surface 51 of the first encapsulation body 50.

In the embodiment, the resilient element 31 is a spring, the first metal sheets 32 and the second metal sheets 33 are made of copper, and surfaces of the first metal sheets 32 and the second metal sheets 33 are coated with tin. In other embodiments, the resilient element 31 can be a metal spring sheet, and surfaces of the first metal sheets 32 and the second metal sheets 33 can be coated with gold or silver according to practical requirements In the embodiment, edges of the first metal sheet 32 and the second metal sheet 33 of each of the metal resilient units 30 are substantially in shape of frustum of a cone, which leads to the epoxy resin securely integrated with the metal resilient units 30 to prevent the metal resilient units 30 from loosening.

With reference to FIG. 2, in the embodiment, the second metal sheets 33 of the metal resilient units 30 are connected together to collectively form a metal shield 90. The metal shield 90 covers the first electronic components 20, and is electrically connected to the conductive layers 13, 14 of the substrate 10, which protects the package structure 100 from electromagnetic interference (EMI).

Figure 3:
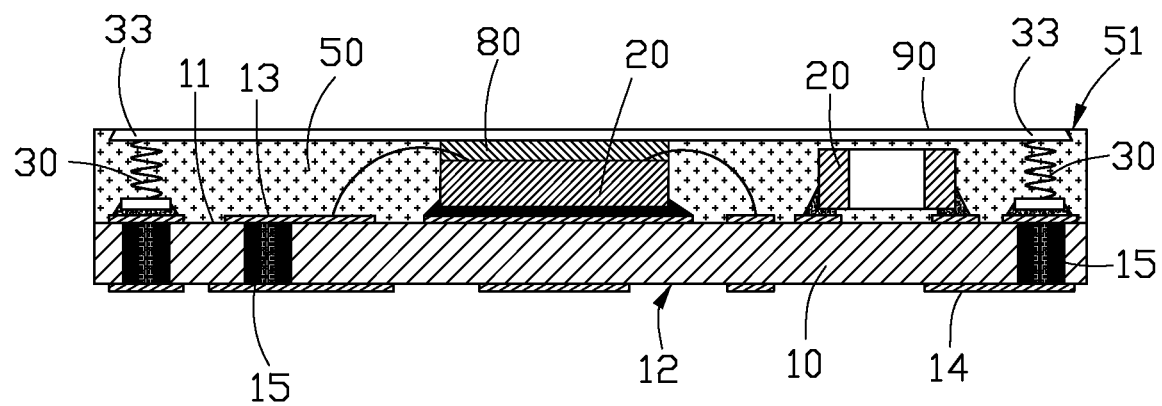
FIG. 3 is a schematic view of the package structure capable of cooling the electronic components of an exemplary embodiment of the disclosure.

Referring to FIG. 3, the first electronic components 20 is adhered to the metal shield 90 by thermal grease 80 configured as a thermal conduction layer to transmit heat from the first electronic components 20 to the metal shield 90. As a result, the metal shield 90 is configured to be a heat sink to cool the first electronic components 20.

Figure 4:
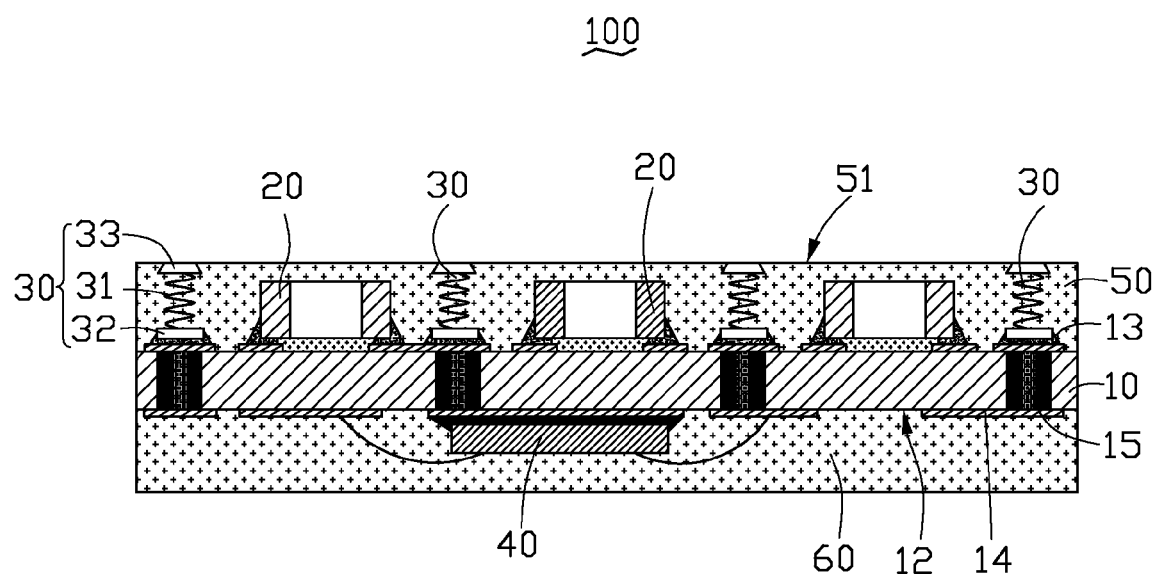
FIG. 4 is a schematic view of the package structure of an exemplary embodiment of the disclosure, in which the package structure is a stacked package.

Referring to FIG. 4, in this embodiment, the package structure 100 can be a stacked package, because a plurality of second electronic component 40 can be packed on the second surface 12 of the substrate 10 by a second encapsulation body 60, due to the input/output interfaces on the second surface 12 of the substrate 10 being transmitted to the exterior surface 51 of the first encapsulation body 50, which leads to small size of the package structure 100.

In summary, the first electronic components 20 are encapsulated in the first encapsulation body 50, and the input/output interfaces of the substrate 10 are transmitted to the exterior surface 51 of the encapsulation body 50 by the metal resilient units 30. By this way, the package structure 100 can employ multifarious first electronic components 20 with different sizes, due to the resilient capability of the metal resilient units 30, which leads to price reduction of the package structure 100 because of simplified fabricating process of the package structure 100. In addition, the package structure 100 can be a stack package, because the second surface 12 of the substrate 10 can pack the second electronic components 40, which leads to small size of the package structure 100.

The fabrication method used to package the first electronic components 20 with different sizes in the first encapsulation body 50 comprises steps as follow.

Figure 5:
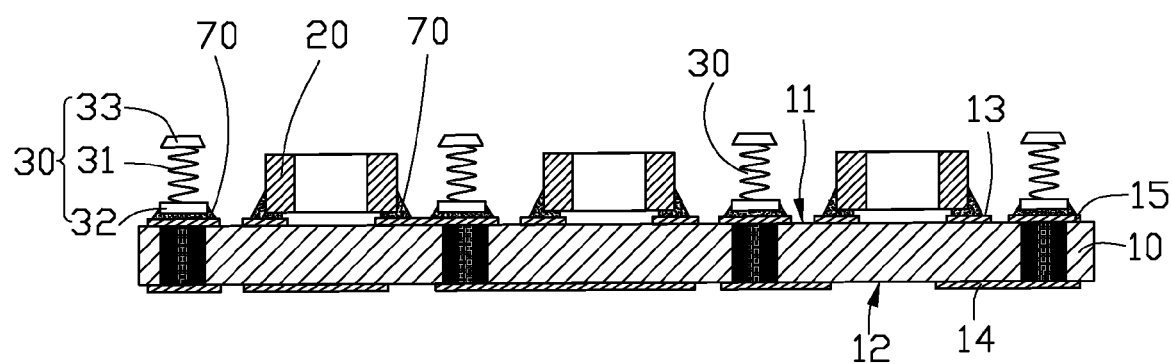
FIG. 5 is a schematic view of fixing the electronic components and the metal resilient units on the substrate.

Referring to FIG. 5, the first electronic components 20 and the metal resilient units 30 are mounted on the substrate 10. In this embodiment, the first electronic components 20 and the metal resilient units 30 are mounted on the substrate 10 by surface mounting technology (SMT). Each of the metal resilient units 30 comprises a metal resilient element 31, a first metal sheet 32 and a second metal sheet 33. The first metal sheet 32 and the second metal sheet 33 are located on two ends of the metal resilient element 31, respectively. The first metal sheet 31 is fixed on the first surface 11 of the substrate 10 and electrically connected to the first conductive layer 13 of the substrate 10 by tins 70.

The first electronic components 20 and the metal resilient units 30 are encapsulated on the substrate 10 to form an encapsulation body 50 with the second metal sheets 33 of the resilient units 30 exposed on the exterior surface 51 of the encapsulation body 50, as shown in FIG. 1. In the embodiment, the encapsulation body 50 is an epoxy resin.

The remaining epoxy resin on the second metal sheets 33 of the resilient units 30 is etched to ensure the second metal sheets 33 the resilient units 30 completely exposed on the exterior surface 51 of the encapsulation body 50.

The second metal sheets 33 of the resilient units 30 are coated with tin by electroplate process. The step can be omitted according to practical requirement.

Although the features and elements of the present disclosure are described as embodiments in particular combinations, each feature or element can be used alone or in other various combinations within the principles of the present disclosure to the full extent indicated by the broad general meaning of the terms in which the appended claims are expressed.

What is claimed is:

1. A package structure comprising a substrate, a plurality of electronic components configured and structured on the substrate, a plurality of metal resilient units electrically connected to the substrate, and an encapsulation body encapsulating the plurality of electronic components and the plurality of resilient units together with the substrate;
   wherein each of the plurality of metal resilient units comprises a metal resilient element, and a first metal sheet and a second metal sheet respectively located at two ends of the metal resilient element, the first metal sheet is electrically connected to the substrate, and the second metal sheet is exposed out of an exterior surface of the encapsulation body; and
   wherein the resilient capability of the metal resilient element prevents epoxy resin from covering the second metal sheet to keep the second metal sheet in a stationary position of being exposed out of the exterior surface of the encapsulation body.

2. The package structure as claimed in claim 1, wherein the first metal sheet and the second metal sheet are both substantially in a shape of a frustum of a cone.

3. The package structure as claimed in claim 1, wherein the metal resilient element is a spring.

4. The package structure as claimed in claim 1, wherein the second metal sheets of the plurality of resilient units are connected together to collectively form a metal shield to protect the electronic components from electromagnetic interference (EMI).

5. The package structure as claimed in claim 4, wherein the electronic components are adhered to the metal shield by thermal grease.

6. The package structure as claimed in claim 1, wherein a surface of the second metal sheet is coplanar with the exterior surface of the encapsulation body.

7. A package structure comprising a substrate, a plurality of electronic components configured and structured on the substrate, a plurality of metal resilient units electrically connected to the substrate, and an encapsulation body encapsulating the plurality of electronic components and the plurality of metal resilient units together with the substrate;
   wherein each of the plurality of metal resilient units comprises a metal resilient element, and a first metal sheet and a second metal sheet respectively located at two ends of the metal resilient element;
   wherein the first metal sheet is electrically connected to the substrate, and the second metal sheet is exposed out of an exterior surface of the encapsulation body; and
   wherein a surface of the second metal sheet is coplanar with the exterior surface of the encapsulation body.

8. The package structure as claimed in claim 7, wherein the first metal sheet and the second metal sheet are both substantially in a shape of a frustum of a cone.

9. The package structure as claimed in claim 7, wherein the metal resilient element is a spring.

10. The package structure as claimed in claim 7, wherein the second metal sheets of the plurality of metal resilient units are connected together to collectively form a metal shield to protect the electronic components from electromagnetic interference (EMI).

11. The package structure as claimed in claim 10, wherein the electronic components are adhered to the metal shield by thermal grease.

* * * * *